(12) United States Patent
Mohammadnezhad et al.

(10) Patent No.: US 12,483,202 B2
(45) Date of Patent: Nov. 25, 2025

(54) WIRELESS AMPLIFIER CIRCUITRY WITH NON-LINEARITY SUPPRESSION

(71) Applicant: Apple Inc., Cupertino, CA (US)

(72) Inventors: Seyed Mohammad Hossein Mohammadnezhad, San Diego, CA (US); Xi Yao, San Diego, CA (US); Aly Ismail, San Diego, CA (US)

(73) Assignee: Apple Inc., Cupertino, CA (US)

( * ) Notice: Subject to any disclaimer, the term of this patent is extended or adjusted under 35 U.S.C. 154(b) by 587 days.

(21) Appl. No.: 17/868,115

(22) Filed: Jul. 19, 2022

(65) Prior Publication Data

US 2024/0030875 A1 Jan. 25, 2024

(51) Int. Cl.
| | | |
|---|---|---|
| *H03F 1/32* | (2006.01) | |
| *H03F 1/56* | (2006.01) | |
| *H03F 3/19* | (2006.01) | |

(52) U.S. Cl.
CPC ............... *H03F 1/32* (2013.01); *H03F 1/565* (2013.01); *H03F 3/19* (2013.01); *H03F 2200/165* (2013.01); *H03F 2200/222* (2013.01); *H03F 2200/451* (2013.01)

(58) Field of Classification Search
CPC .......... H03F 1/32; H03F 1/565; H03F 1/3205; H03F 1/223; H03F 1/26; H03F 3/19; H03F 3/193; H03F 3/45188; H03F 2200/165; H03F 2200/222; H03F 2200/451; H03F 2203/45386
USPC ... 330/124 R, 295, 283, 154, 165, 171, 188, 330/190, 195, 197, 276, 301
See application file for complete search history.

(56) References Cited

U.S. PATENT DOCUMENTS

| | | | |
|---|---|---|---|
| 7,663,441 B2 * | 2/2010 | Kang | H03F 1/26 330/281 |
| 9,413,296 B2 * | 8/2016 | Lu | H03F 1/223 |
| 10,110,166 B1 | 10/2018 | Noori | |
| 11,159,191 B1 | 10/2021 | Mohammadnezhad et al. | |
| 2006/0164171 A1 * | 7/2006 | Wu | H03F 1/223 330/301 |
| 2011/0018635 A1 | 1/2011 | Tasic et al. | |
| 2015/0207482 A1 | 7/2015 | Abdel Ghany et al. | |
| 2015/0349722 A1 * | 12/2015 | Wang | H04B 1/40 330/295 |

(Continued)

OTHER PUBLICATIONS

U.S. Appl. No. 17/835,594, filed Jun. 8, 2022.

*Primary Examiner* — Andrea Lindgren Baltzell
*Assistant Examiner* — Nareh Shamiryan
(74) *Attorney, Agent, or Firm* — Treyz Law Group, P.C.; Tianyi He

(57) ABSTRACT

An electronic device may include wireless circuitry with a processor, a transceiver circuit, a front-end module, and an antenna. The front-end module may include amplifier circuitry such as a low noise amplifier for amplifying received radio-frequency signals. The amplifier circuitry may include non-linearity suppression circuitry that suppresses or reduces non-linear behavior of components such as a core amplification transistor and a degeneration inductor within the amplifier circuitry. The non-linearity suppression circuitry may include an intermodulation distortion suppression circuit having an auxiliary amplification transistor. The non-linearity suppression circuitry may include a frequency-selective filter coupled to the degeneration inductor.

20 Claims, 7 Drawing Sheets

(56) References Cited

U.S. PATENT DOCUMENTS

2016/0336983 A1* 11/2016 Wang ................ H04B 1/0458
2018/0069510 A1*  3/2018 Granger-Jones .... H03F 3/45475
2019/0288649 A1*  9/2019 Gaynor .............. H03F 1/223

* cited by examiner

WIRELESS AMPLIFIER CIRCUITRY WITH NON-LINEARITY SUPPRESSION

FIELD

This application relates generally to electronic devices and, more particularly, to electronic devices with wireless communications circuitry.

BACKGROUND

Electronic devices can be provided with wireless communications capabilities. An electronic device with wireless communications capabilities has wireless communications circuitry with one or more antennas. Wireless receiver circuitry in the wireless communications circuitry uses the antennas to receive radio-frequency signals.

Signals received by the antennas are fed through a radio-frequency front-end module, which can include a low noise amplifier for amplifying the received radio-frequency signals. It can be challenging to design satisfactory low noise amplifier circuitry for an electronic device.

SUMMARY

An electronic device may include wireless circuitry with a processor, a transceiver circuit, a front-end module, and an antenna. The front-end module may include amplifier circuitry such as a low noise amplifier for amplifying received radio-frequency signals. The amplifier circuitry may include non-linearity suppression circuitry that suppresses or reduces non-linear behavior of components such as a core amplification transistor and a degeneration inductor within the amplifier circuitry. The non-linearity suppression circuitry may include an intermodulation distortion suppression circuit having an auxiliary amplification transistor coupled in parallel with the core amplification transistor. The non-linearity suppression circuitry may include a frequency-selective filter coupled to the degeneration inductor.

An aspect of the disclosure provides amplifier circuitry that includes an amplification transistor having a gate terminal configured to receive a radio-frequency signal, a drain terminal coupled to an output port of the amplifier circuitry, and a source terminal; a degeneration inductor coupled to the source terminal of the amplification transistor; and a filter coupled to the degeneration inductor. The filter can be coupled to the source terminal of the amplification transistor. The radio-frequency signal can have a fundamental frequency, and the filter can include a notch filter configured to filter out a harmonic frequency of the fundamental frequency. The filter can include an inductor having a first terminal coupled to the source terminal of the amplification transistor and having a second terminal; and a capacitor having a first terminal coupled to the second terminal of the inductor and having a second terminal coupled to a supply voltage terminal. The capacitor can include an adjustable capacitance. The inductor of the filter can be coupled to the degeneration inductor to form a transformer. The amplifier circuitry can include an auxiliary transistor having a gate terminal configured to receive the radio-frequency signal, a drain terminal coupled to the output port of the amplifier circuitry, and a source terminal coupled to the source terminal of the amplification transistor. The filter can be coupled to the source terminal of the amplification transistor and the source terminal of the auxiliary transistor. The amplifier circuitry can include an input matching network coupled between an input port of the amplifier circuitry and the gate terminal of the amplification transistor; and an input capacitor having a first terminal coupled to the input matching network and a second terminal coupled to the gate terminal of the amplification transistor. The amplifier circuitry can include a cascode stage coupled between the drain terminal of the amplification transistor and the output port of the amplifier circuitry. The output port of the amplifier circuitry can form a differential output, and the amplifier circuitry can include a transformer coupled between the cascode stage and the differential output.

An aspect of the disclosure provides an amplifier that includes a first transistor having a gate terminal configured to receive a radio-frequency signal, a source terminal, and a drain terminal, the gate terminal of the first transistor being configured to receive a first bias voltage that biases the first transistor in strong inversion; and a second transistor having a gate terminal configured to receive the radio-frequency signal, a source terminal coupled to the source terminal of the first transistor, and a drain terminal coupled to the drain terminal of the first transistor, the gate terminal being configured to receive a second bias voltage that biases the second transistor in weak inversion. The drain terminal of the first transistor can be coupled to an output port of the amplifier and the drain terminal of the second transistor can be coupled to the output port of the amplifier. The amplifier can include an inductor coupled to the source terminal of the first transistor and the source terminal of the second transistor. The amplifier can include a first resistor having a first terminal coupled to a first voltage supply terminal and having a second terminal coupled to the gate terminal of the first transistor; and a second resistor having a first terminal coupled to a second voltage supply terminal and having a second terminal coupled to the gate terminal of the second transistor. The first voltage supply terminal can be configured to supply the first bias voltage through the first resistor to the gate terminal of the first transistor, and the second voltage supply terminal can be configured to supply the second bias voltage through the second resistor to the gate terminal of the second transistor. The first transistor biased in strong inversion can have a first non-linearity coefficient, and the second transistor biased in weak inversion can have a second non-linearity coefficient that has an opposite sign compared to the first non-linearity coefficient.

An aspect of the disclosure provides amplifier circuitry that includes an amplification transistor configured to receive radio-frequency signals and to output corresponding amplified radio-frequency signals; and a distortion suppression circuit coupled to a source terminal of the amplification transistor and configured to suppress non-linearity distortion of the amplified radio-frequency signals. The amplifier circuitry can include an inductor having a first terminal coupled to the source terminal of the amplification transistor and having a second terminal coupled to a ground supply voltage terminal. The radio-frequency signals can include a fundamental frequency. The distortion suppression circuit can include a harmonic distortion suppression circuit configured to filter out harmonic distortion generated by the amplification transistor that can cause further amplifier non-linearity via degeneration inductor feedback. The amplification transistor can have a first non-linearity coefficient. The distortion suppression circuit can include an intermodulation distortion suppression circuit with an auxiliary transistor having a second corresponding non-linearity coefficient with similar magnitude but an opposite sign compared to the first non-linearity coefficient of the amplification transistor.

DETAILED DESCRIPTION

Figure 1:
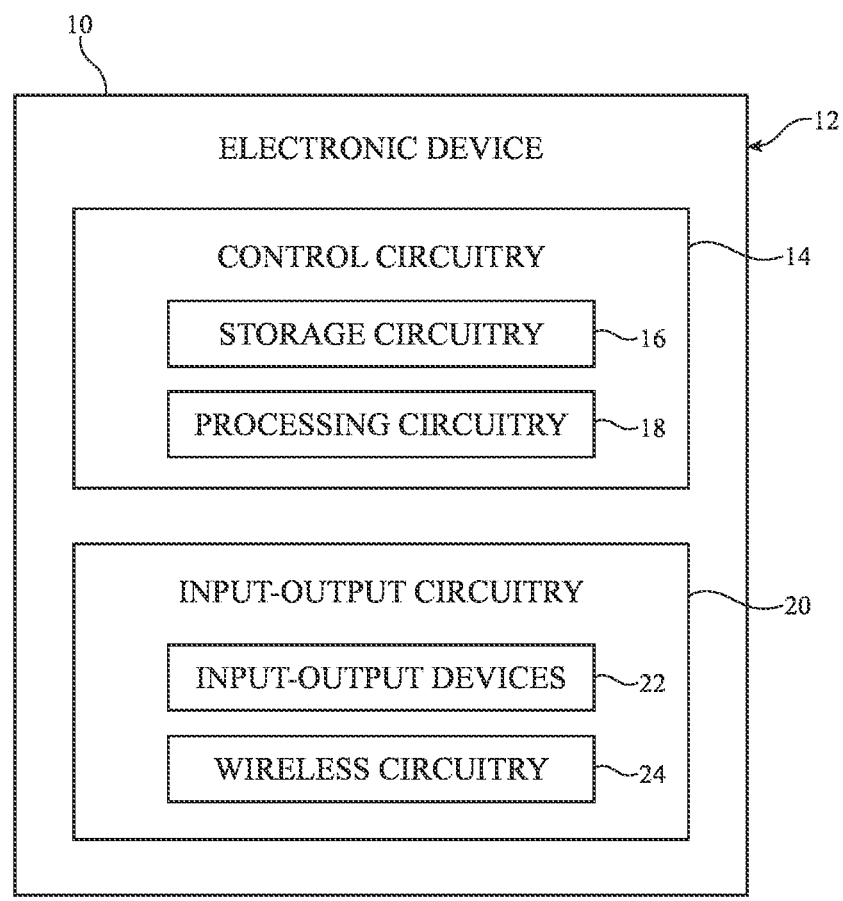
FIG. 1 is a diagram of an illustrative electronic device having wireless circuitry in accordance with some embodiments.

An electronic device such as electronic device 10 of FIG. 1 may be provided with wireless circuitry. The wireless circuitry may include an amplifier such as a low noise amplifier having non-linearity suppression circuitry that suppresses non-linear behavior within the low noise amplifier. The non-linearity suppression circuitry may include an intermodulation distortion suppression circuit that reduces intermodulation distortion signals within the low noise amplifier. The non-linearity suppression circuitry may include a harmonic distortion suppression circuit that reduces harmonic distortion signals within the low noise amplifier. Reducing these undesired signals can help the low noise amplifier exhibit a more linear response during operation. One or more low noise amplifiers containing any type of non-linearity suppression circuitry can be included in any type of electronic device 10.

Electronic device 10 of FIG. 1 may be a computing device such as a laptop computer, a desktop computer, a computer monitor containing an embedded computer, a tablet computer, a cellular telephone, a media player, or other handheld or portable electronic device, a smaller device such as a wristwatch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, a wireless internet-connected voice-controlled speaker, a home entertainment device, a remote control device, a gaming controller, a peripheral user input device, a wireless base station or access point, equipment that implements the functionality of two or more of these devices, or other electronic equipment.

As shown in the functional block diagram of FIG. 1, device 10 may include components located on or within an electronic device housing such as housing 12. Housing 12, which may sometimes be referred to as a case, may be formed from plastic, glass, ceramics, fiber composites, metal (e.g., stainless steel, aluminum, metal alloys, etc.), other suitable materials, or a combination of these materials. In some embodiments, parts or all of housing 12 may be formed from dielectric or other low-conductivity material (e.g., glass, ceramic, plastic, sapphire, etc.). In other embodiments, housing 12 or at least some of the structures that make up housing 12 may be formed from metal elements.

Device 10 may include control circuitry 14. Control circuitry 14 may include storage such as storage circuitry 16. Storage circuitry 16 may include hard disk drive storage, nonvolatile memory (e.g., flash memory or other electrically-programmable-read-only memory configured to form a solid-state drive), volatile memory (e.g., static or dynamic random-access-memory), etc. Storage circuitry 16 may include storage that is integrated within device 10 and/or removable storage media.

Control circuitry 14 may include processing circuitry such as processing circuitry 18. Processing circuitry 18 may be used to control the operation of device 10. Processing circuitry 18 may include one or more microprocessors, microcontrollers, digital signal processors, host processors, baseband processor integrated circuits, application specific integrated circuits, central processing units (CPUs), etc. Control circuitry 14 may be configured to perform operations in device 10 using hardware (e.g., dedicated hardware or circuitry), firmware, and/or software. Software code for performing operations in device 10 may be stored on storage circuitry 16 (e.g., storage circuitry 16 may include non-transitory (tangible) computer readable storage media that stores the software code). The software code may sometimes be referred to as program instructions, software, data, instructions, or code. Software code stored on storage circuitry 16 may be executed by processing circuitry 18.

Control circuitry 14 may be used to run software on device 10 such as satellite navigation applications, internet browsing applications, voice-over-internet-protocol (VOIP) telephone call applications, email applications, media playback applications, operating system functions, etc. To support interactions with external equipment, control circuitry 14 may be used in implementing communications protocols. Communications protocols that may be implemented using control circuitry 14 include internet protocols, wireless local area network (WLAN) protocols (e.g., IEEE 802.11 protocols—sometimes referred to as Wi-Fi®), protocols for other short-range wireless communications links such as the Bluetooth® protocol or other wireless personal area network (WPAN) protocols, IEEE 802.11ad protocols (e.g., ultra-wideband protocols), cellular telephone protocols (e.g., 3G protocols, 4G (LTE) protocols, 5G protocols, etc.), antenna diversity protocols, satellite navigation system protocols (e.g., global positioning system (GPS) protocols, global navigation satellite system (GLONASS) protocols, etc.), antenna-based spatial ranging protocols (e.g., radio detection and ranging (RADAR) protocols or other desired range detection protocols for signals conveyed at millimeter and centimeter wave frequencies), or any other desired communications protocols. Each communications protocol may be associated with a corresponding radio access technology (RAT) that specifies the physical connection methodology used in implementing the protocol.

Device 10 may include input-output circuitry 20. Input-output circuitry 20 may include input-output devices 22. Input-output devices 22 may be used to allow data to be supplied to device 10 and to allow data to be provided from device 10 to external devices. Input-output devices 22 may include user interface devices, data port devices, and other input-output components. For example, input-output devices 22 may include touch sensors, displays (e.g., touch-sensitive and/or force-sensitive displays), light-emitting components such as displays without touch sensor capabilities, buttons (mechanical, capacitive, optical, etc.), scrolling wheels, touch pads, key pads, keyboards, microphones, cameras, buttons, speakers, status indicators, audio jacks and other audio port components, digital data port devices, motion sensors (accelerometers, gyroscopes, and/or compasses that detect motion), capacitance sensors, proximity sensors, magnetic sensors, force sensors (e.g., force sensors coupled to a display to detect pressure applied to the display), etc. In some configurations, keyboards, headphones, displays, pointing devices such as trackpads, mice, and joysticks, and other input-output devices may be coupled to device 10 using wired or wireless connections (e.g., some of input-output devices 22 may be peripherals that are coupled to a main processing unit or other portion of device 10 via a wired or wireless link).

Input-output circuitry 20 may include wireless circuitry 24 to support wireless communications. Wireless circuitry 24 (sometimes referred to herein as wireless communications circuitry 24) may include one or more antennas. Wireless circuitry 24 may also include baseband processor circuitry or other processor circuitry, transceiver circuitry, amplifier circuitry, filter circuitry, switching circuitry, radio-frequency transmission lines, and/or any other circuitry for transmitting and/or receiving radio-frequency signals using the antenna(s).

Wireless circuitry 24 may transmit and/or receive radio-frequency signals within a corresponding frequency band at radio frequencies (sometimes referred to herein as a communications band or simply as a "band"). The frequency bands handled by wireless circuitry 24 may include wireless local area network (WLAN) frequency bands (e.g., Wi-Fi® (IEEE 802.11) or other WLAN communications bands) such as a 2.4 GHz WLAN band (e.g., from 2400 to 2480 MHz), a 5 GHz WLAN band (e.g., from 5180 to 5825 MHz), a Wi-Fi® 6E band (e.g., from 5925-7125 MHz), and/or other Wi-Fi® bands (e.g., from 1875-5160 MHz), wireless personal area network (WPAN) frequency bands such as the 2.4 GHz Bluetooth® band or other WPAN communications bands, cellular telephone frequency bands (e.g., bands from about 600 MHz to about 5 GHz, 3G bands, 4G LTE bands, 5G New Radio Frequency Range 1 (FR1) bands below 10 GHz, 5G New Radio Frequency Range 2 (FR2) bands between 20 and 60 GHz, etc.), other centimeter or millimeter wave frequency bands between 10-300 GHz, near-field communications frequency bands (e.g., at 13.56 MHz), satellite navigation frequency bands (e.g., a GPS band from 1565 to 1610 MHz, a Global Navigation Satellite System (GLONASS) band, a BeiDou Navigation Satellite System (BDS) band, etc.), ultra-wideband (UWB) frequency bands that operate under the IEEE 802.15.4 protocol and/or other ultra-wideband communications protocols, communications bands under the family of 3GPP wireless communications standards, communications bands under the IEEE 802.XX family of standards, and/or any other desired frequency bands of interest.

Figure 2:
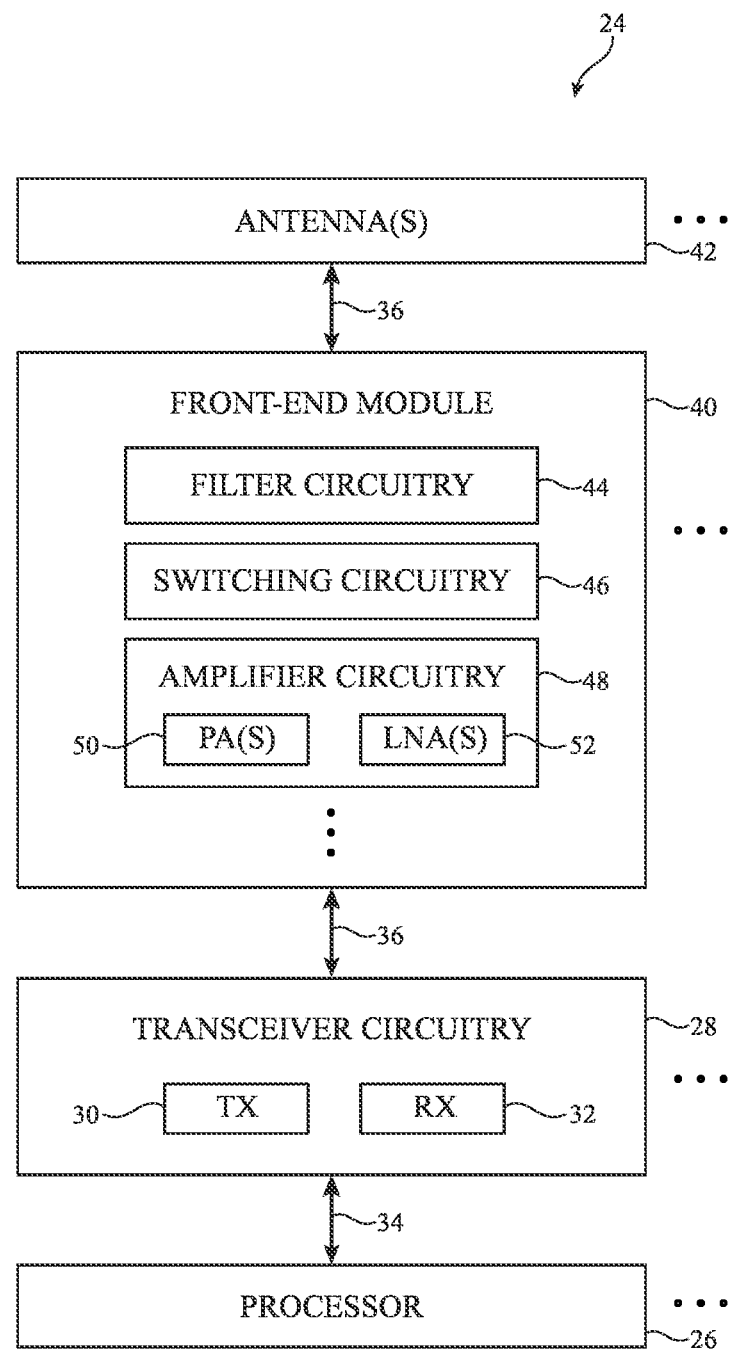
FIG. 2 is a diagram of illustrative wireless communications circuitry having a front-end module in accordance with some embodiments.

FIG. 2 is a diagram showing illustrative components within wireless circuitry 24. As shown in FIG. 2, wireless circuitry 24 may include one or more processors such as processor(s) 26, radio-frequency (RF) transceiver circuitry such as radio-frequency transceiver 28, radio-frequency front end circuitry such as radio-frequency front end module (FEM) 40, and antenna(s) 42. Processor 26 may be a baseband processor, an application processor, a digital signal processor, a microcontroller, a microprocessor, a central processing unit (CPU), a programmable device, a combination of these circuits, and/or one or more processors within circuitry 18. Processor 26 may be configured to generate digital (transmit or baseband) signals. Processor 26 may be coupled to transceiver 28 over path 34 (sometimes referred to as a baseband path). Transceiver 28 may be coupled to antenna 42 via radio-frequency transmission line path 36. Radio-frequency front end module 40 may be disposed on radio-frequency transmission line path 36 between transceiver 28 and antenna 42.

Wireless circuitry 24 may include one or more antennas such as antenna 42. Antenna 42 may be formed using any desired antenna structures. For example, antenna 42 may be an antenna with a resonating element that is formed from loop antenna structures, patch antenna structures, inverted-F antenna structures, slot antenna structures, planar inverted-F antenna structures, helical antenna structures, monopole antennas, dipoles, hybrids of these designs, etc. Two or more antennas 42 may be arranged into one or more phased antenna arrays (e.g., for conveying radio-frequency signals at millimeter wave frequencies). Parasitic elements may be included in antenna 42 to adjust antenna performance. Antenna 42 may be provided with a conductive cavity that backs the antenna resonating element of antenna 42 (e.g., antenna 42 may be a cavity-backed antenna such as a cavity-backed slot antenna).

In the example of FIG. 2, wireless circuitry 24 is illustrated as including only a single processor 26, a single transceiver 28, a single front end module 40, and a single antenna 42 for the sake of clarity. In general, wireless circuitry 24 may include any desired number of processors 26, any desired number of transceivers 36, any desired number of front end modules 40, and any desired number of antennas 42. Each processor 26 may be coupled to one or more transceiver 28 over respective paths 34. Each transceiver 28 may include a transmitter circuit 30 configured to output uplink signals to antenna 42, may include a receiver circuit 32 configured to receive downlink signals from antenna 42, and may be coupled to one or more antennas 42 over respective radio-frequency transmission line paths 36. Each radio-frequency transmission line path 36 may have a respective front end module 40 disposed thereon. If desired, two or more front end modules 40 may be disposed on the same radio-frequency transmission line path 36. If desired, one or more of the radio-frequency transmission line paths 36 in wireless circuitry 24 may be implemented without any front end module disposed thereon.

Front end module (FEM) 40 may include radio-frequency front end circuitry that operates on the radio-frequency signals conveyed (transmitted and/or received) over radio-frequency transmission line path 36. FEM 40 may, for example, include front end module (FEM) components such as radio-frequency filter circuitry 44 (e.g., low pass filters, high pass filters, notch filters, band pass filters, multiplexing circuitry, duplexer circuitry, diplexer circuitry, triplexer circuitry, etc.), switching circuitry 46 (e.g., one or more radio-frequency switches), radio-frequency amplifier circuitry 48 (e.g., one or more power amplifier circuits 50 and/or one or more low-noise amplifier circuits 52), impedance matching circuitry (e.g., circuitry that helps to match the impedance of antenna 42 to the impedance of radio-frequency transmission line 36), antenna tuning circuitry (e.g., networks of capacitors, resistors, inductors, and/or switches that adjust the frequency response of antenna 42), radio-frequency coupler circuitry, charge pump circuitry, power management circuitry, digital control and interface circuitry, and/or any other desired circuitry that operates on the radio-frequency signals transmitted and/or received by antenna 42. Each of the front end module components may be mounted to a common (shared) substrate such as a rigid printed circuit board substrate or flexible printed circuit substrate. If desired, the various front end module components may also be integrated into a single integrated circuit chip.

Filter circuitry 44, switching circuitry 46, amplifier circuitry 48, and other circuitry may be disposed on radio-frequency transmission line path 36, may be incorporated into FEM 40, and/or may be incorporated into antenna 42 (e.g., to support antenna tuning, to support operation in desired frequency bands, etc.). These components, sometimes referred to herein as antenna tuning components, may be adjusted (e.g., using control circuitry 14) to adjust the frequency response and wireless performance of antenna 42 over time.

Radio-frequency transmission line path 36 may be coupled to an antenna feed on antenna 42. The antenna feed may, for example, include a positive antenna feed terminal and a ground antenna feed terminal. Radio-frequency transmission line path 36 may have a positive transmission line signal path such that is coupled to the positive antenna feed terminal on antenna 42. Radio-frequency transmission line path 36 may have a ground transmission line signal path that is coupled to the ground antenna feed terminal on antenna 42. This example is illustrative and, in general, antennas 42 may be fed using any desired antenna feeding scheme. If desired, antenna 42 may have multiple antenna feeds that are coupled to one or more radio-frequency transmission line paths 36.

Radio-frequency transmission line path 36 may include transmission lines that are used to route radio-frequency antenna signals within device 10 (FIG. 1). Transmission lines in device 10 may include coaxial cables, microstrip transmission lines, stripline transmission lines, edge-coupled microstrip transmission lines, edge-coupled stripline transmission lines, transmission lines formed from combinations of transmission lines of these types, etc. Transmission lines in device 10 such as transmission lines in radio-frequency transmission line path 36 may be integrated into rigid and/or flexible printed circuit boards. In one suitable arrangement, radio-frequency transmission line paths such as radio-frequency transmission line path 36 may also include transmission line conductors integrated within multilayer laminated structures (e.g., layers of a conductive material such as copper and a dielectric material such as a resin that are laminated together without intervening adhesive). The multilayer laminated structures may, if desired, be folded or bent in multiple dimensions (e.g., two or three dimensions) and may maintain a bent or folded shape after bending (e.g., the multilayer laminated structures may be folded into a particular three-dimensional shape to route around other device components and may be rigid enough to hold its shape after folding without being held in place by stiffeners or other structures). All of the multiple layers of the laminated structures may be batch laminated together (e.g., in a single pressing process) without adhesive (e.g., as opposed to performing multiple pressing processes to laminate multiple layers together with adhesive).

Transceiver circuitry 28 may include wireless local area network transceiver circuitry that handles WLAN communications bands (e.g., Wi-Fi® (IEEE 802.11) or other WLAN communications bands) such as a 2.4 GHz WLAN band (e.g., from 2400 to 2480 MHz), a 5 GHz WLAN band (e.g., from 5180 to 5825 MHz), a Wi-Fi® 6E band (e.g., from 5925-7125 MHz), and/or other Wi-Fi® bands (e.g., from 1875-5160 MHz), wireless personal area network transceiver circuitry that handles the 2.4 GHz Bluetooth® band or other WPAN communications bands, cellular telephone transceiver circuitry that handles cellular telephone bands (e.g., bands from about 600 MHz to about 5 GHz, 3G bands, 4G LTE bands, 5G New Radio Frequency Range 1 (FR1) bands below 10 GHz, 5G New Radio Frequency Range 2 (FR2) bands between 20 and 60 GHz, etc.), near-field communications (NFC) transceiver circuitry that handles near-field communications bands (e.g., at 13.56 MHz), satellite navigation receiver circuitry that handles satellite navigation bands (e.g., a GPS band from 1565 to 1610 MHz, a Global Navigation Satellite System (GLONASS) band, a BeiDou Navigation Satellite System (BDS) band, etc.), ultra-wideband (UWB) transceiver circuitry that handles communications using the IEEE 802.15.4 protocol and/or other ultra-wideband communications protocols, and/or any other desired radio-frequency transceiver circuitry for covering any other desired communications bands of interest.

As described above, front end module 40 may include one or more low noise amplifiers (LNAs) 52 in the receive (downlink) path. A low noise amplifier 52 (sometimes referred to as low noise amplifier circuitry or amplifier circuitry) may be configured to amplify a received radio-frequency signal without significantly degrading the signal-to-noise (SNR) ratio of the amplified signal. Low noise amplifier 52 may, for example, be used to provide 2 dB of voltage gain, 3 dB of voltage gain, 4 dB of voltage gain, 5 dB of voltage gain, 6 dB of voltage gain, 3-4 dB of voltage gain, 2-5 dB of voltage gain, 5-10 dB of voltage gain, or other suitable amounts of voltage gain.

Additionally, it may be desirable for low noise amplifier 52 to amplify an input radio-frequency signal having one or more desired radio-frequencies in a linear manner such that the output signal is proportional to the input signal, e.g., at least across the voltages and frequencies of operation. However, in practice, one or more components within low noise amplifier 52 can exhibit non-linear behavior, thereby degrading the performance of low noise amplifier 52. To mitigate these issues, low noise amplifier 52 may include non-linearity suppression circuitry configured to suppress the non-linear behavior of one or more of these components within low noise amplifier 52.

Figure 3:
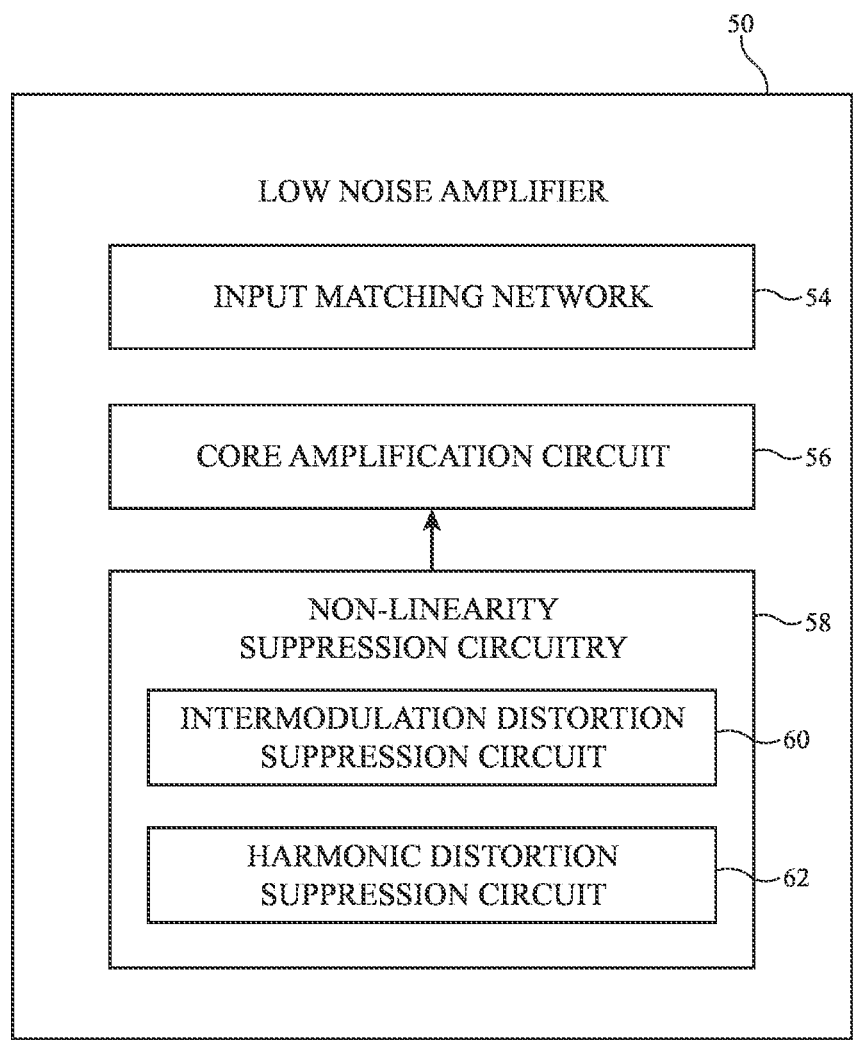
FIG. 3 is a schematic diagram of an illustrative low noise amplifier in accordance with some embodiments.

FIG. 3 is a schematic diagram of an illustrative low noise amplifier 52 having non-linearity suppression circuitry of different types (sometimes referred to herein as different types of distortion suppression circuits). As shown in FIG. 3, low noise amplifier 52 may include an input matching network such as input matching network 54, a core amplification circuit such as core amplification circuit 56, and non-linearity suppression circuitry such as non-linearity suppression circuitry 58.

An input port of low noise amplifier 52 configured to receive an input radio-frequency signal to be amplified may be coupled to input matching network 54. Input matching network 54 may be configured to provide a proper input impedance at the input port of low noise amplifier 52 to help provide maximal power transfer while minimizing signal reflection back to the preceding stage in the front end module.

Core amplification circuit 56 may include one or more amplification component such as one or more amplification transistors that provide the main amplification transfer function of low noise amplifier 52. As an example, in a simple configuration, core amplification circuit 56 may include one main amplification transistor that receives the input radio-frequency signal at its gate terminal and generates an amplified output signal at its drain terminal. If desired, core amplification circuitry 56 may include multiple amplification stages (e.g., multiple such amplification transistors, with the gate terminal of an amplification transistor coupled to the drain terminal of the preceding amplification transistor).

In other more complex configurations, core amplification circuit 56 may include other components that enhance the performance of the amplification transistor(s) and/or of low noise amplifier 52. As an example, core amplification circuit 56 may include degeneration inductor circuitry (e.g., degeneration transformer circuitry) having one or more inductors coupled to the respective source terminal(s) of one or more amplification transistors. Providing inductive components at the source terminals within low noise amplifier 52 (a technique sometimes referred to as source degeneration) may affect the gain and the input impedance of the coupled amplification transistor (and therefore of amplifier 52). In particular, increasing the overall inductance of the degeneration inductor circuitry may reduce the voltage gain of the amplification transistor. Accordingly, decreasing the overall inductance of the degeneration inductor circuitry may increase the voltage gain of the amplification transistor. The inductance of the degeneration inductor may also affect a quality factor (Q factor) associated with the input impedance of the amplification transistor (and therefore amplifier 52). In particular, decreasing the overall inductance of degeneration inductor circuitry may increase the Q factor of the input impedance. Accordingly, increasing the overall inductance of the degeneration inductor circuitry may reduce the Q factor of the input impedance. In such a manner, the performance of the amplification transistor and amplifier 52 may be enhanced by providing and tuning the parameters of the degeneration inductor circuitry.

If desired, the Q factor of the degeneration inductor circuitry may be low. For example, the Q factor of the degeneration inductor circuitry may be no greater than 10, no greater than 11, no greater than 12, less than 15, less than 20, 10 to 12, 9 to 13, 8 to 14, 7 to 15, or other suitable low quality factor value. Using degeneration inductor circuitry with such low Q factor values can help minimize the area required to fabricate the degeneration inductor circuitry, which keeps the overall size of low noise amplifier 52 relatively compact.

In some configurations, components such as the amplification transistor within core amplification circuit 56 may produce or otherwise exhibit non-linear behavior (e.g., inherently or caused by other coupled components such as degeneration inductor circuitry). To suppresses this type of non-linear behavior, low noise amplifier 52 may include non-linearity suppression circuitry 58 (sometimes referred to as non-linear behavior suppression circuitry or distortion suppression circuitry).

As a first example of non-linear behavior, when the amplification transistor is biased in a strong inversion mode of operation (e.g., while performing its amplification functions), the amplification transistor may exhibit a negative third-order non-linearity coefficient gm3 (sometimes referred to as the third-order transconductance). In the absence of any suppression scheme, this non-zero non-linearity coefficient gm3 may lead the amplification transistor to exhibit intermodulation distortion, thereby causing the amplification transistor to produce an output signal with an undesirable (third-order) intermodulation, or generally, non-linearity component (e.g., at an intermodulation frequency resulting from the combination of the fundamental and/or harmonic frequencies of the received input signal). To suppress the generation of this undesired intermodulation component and/or other intermodulation distortion effects, low noise amplifier 52 may include intermodulation distortion suppression circuit 60 (sometimes referred to simply as distortion suppression circuit 60 of a first type).

As a second example of non-linear behavior, in configurations in which the source terminal of the amplification transistor is coupled to a degeneration inductor, the degeneration inductor may cause the generation and propagation of harmonic signals (e.g., at the harmonic frequencies relative to the fundamental frequencies of the received input signal) to the source terminal of the amplification transistor. In the absence of any suppression scheme, these harmonic signals (and to a lesser extent, intermodulation signals generated by the inductor) may combine with the received input signal (e.g., via the second-order non-linearity coefficient gm2 of the amplification transistor), thereby causing the amplification transistor to produce an output signal with an undesirable (third-order) intermodulation component. To suppress the generation or propagation of these harmonic signals and/or other harmonic distortion effects, low noise amplifier 52 may include harmonic distortion suppression circuit 62 (sometimes referred to simply as distortion suppression circuit 62 of a second type).

These examples are illustrative of only some of the non-linear behavior that can be exhibited within low noise amplifier 52. If desired, distortion suppression circuits 60 and 62 may also suppress other sources of intermodulation and harmonic distortion. While low noise amplifier 52 is shown with both types of distortion suppression circuits 60 and 62, low noise amplifier 52 may include only one type of distortion suppression circuit, if desired (e.g., in configuration where the effects of unaddressed types of distortion is below a threshold at one or more operational frequencies), or may include additional types of distortion suppression circuits, if desired.

The various constituent components described in connection with input matching network 54, core amplification circuit 56, and non-linearity suppression circuitry 58 as part of amplifier 52 shown in FIG. 3 are illustrative. If desired, any of these components might optionally be excluded from low noise amplifier 52. If desired, low noise amplifier 52 may also include other components necessary to enable proper amplification without introducing excessive noise.

Figure 4:
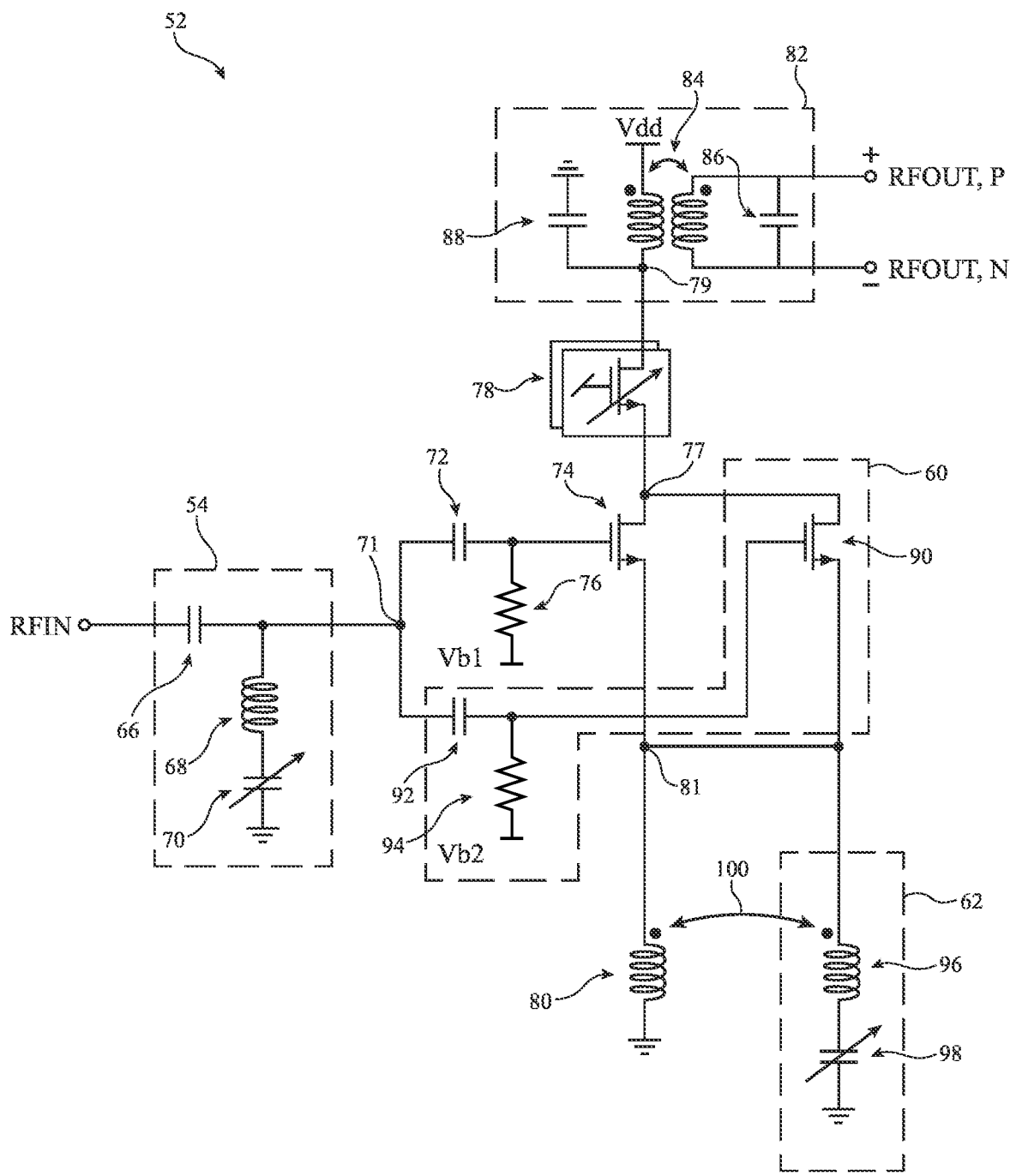
FIG. 4 is a circuit diagram showing an illustrative implementation of a low noise amplifier of the type shown in FIG. 3 in accordance with some embodiments.

FIG. 4 is a circuit diagram illustrating one configuration of low noise amplifier 52. As shown in FIG. 4, low noise amplifier 52 may include an input port (terminal) RFIN configured to receive a radio-frequency input signal from the antenna. As described in connection with FIG. 2, one or more circuits such as filter circuitry, switching circuitry, antenna tuning circuitry, and/or other control circuitry may optionally be coupled along the radio-frequency transmission line path between the antenna and the amplifier input port RFIN. A local input matching network such as input matching network 54 may be coupled to input terminal RFIN.

In the example of FIG. 4, input matching network 54 may include a series capacitor such as capacitor 66 with a first terminal coupled to the RFIN port and a second terminal coupled to node 71. Node 71 may be coupled to the core amplification circuit (e.g., amplification transistor 74). Input matching network 54 may further include a shunt inductor such as inductor 68 having a first terminal coupled to node 71 and a second terminal coupled to a ground power supply line (sometimes referred to as ground line on which ground voltage Vss is provided) via a capacitor such as variable capacitor 70. This example in which input matching network 54 includes a series capacitor 66 coupled to input RFIN, a shunt inductor 68, and a variable capacitor 70 is illustrative. As other examples, input matching network 54 might include three or more passive components (e.g., capacitors, inductors, and/or resistors) coupled in some series and/or shunt configurations relative to one another. As yet other examples, input matching network 54 might include four or more passive components coupled in some series/shunt configuration. In general, input matching network 54 may include any suitable number of passive components connected in a hybrid series-shunt configuration. If desired, the hybrid series-shunt configuration of the passive components may form frequency- selective filters such as notch filters for filtering out one or more frequencies based on the input signal received at input RFIN.

Amplification transistor 74 (sometimes referred to as core amplification transistor 74 or main amplification transistor 74) may be coupled to node 71 via an input capacitor such as capacitor 72 and may be coupled to amplifier input RFIN via matching network 54 and capacitor 72. Transistor 74 may be an n-type transistor (e.g., an n-channel transistor such as an n-type metal-oxide-semiconductor or NMOS device). N-type transistor 74 may have a drain terminal coupled to drain node 77, a gate terminal coupled to input RFIN via coupling capacitor 72, and a source terminal coupled to source node 81. The terms "source" and "drain" are sometimes used interchangeably when referring to a transistor. The source and drain terminals are therefore sometimes referred to as source-drain terminals (e.g., a transistor has a gate terminal and first and second source-drain terminals).

The gate terminal of transistor 74 may further be coupled to resistor 76, which is configured to receive a bias voltage Vb1 (e.g., through a supply voltage line supplying bias voltage Vb1). Voltage Vb1 may have some intermediate voltage level between the ground voltage level and a positive power supply voltage level Vdd that powers amplifier 52. The drain terminal of transistor 74 may further be coupled to a cascode device or cascode such as cascode stage 78 including one or more cascode transistors. The one or more cascode transistor in combination with amplification transistor 74 may sometimes be referred to as a cascode amplifier, a cascode amplifier circuit, a cascode amplifier stage, or simply an amplifier stage, and may collectively form a portion of the core amplification circuit (e.g., core amplification circuit 56 in FIG. 3). The output terminal of cascode stage 78 at node 79 may produce the output radio-frequency signal corresponding to an amplified version of the input radio-frequency signal received at input RFIN.

In the example of FIG. 4, node 79 is further coupled to an impedance transformation circuit, such as transformer-based converter circuit 82, that converters the single-ended output radio-frequency signal output by the core amplification circuit (e.g., cascode stage 78) to the corresponding differential output radio-frequency signals at output ports (terminals) RFOUT, P, and RFOUT, N, forming a differential output. As shown in FIG. 4, impedance transformation circuit 82 may include transformer 84. A first (primary) winding of transformer 84 may be coupled between the positive power supply line (e.g., a positive power supply terminal on which voltage Vdd is provided) and node 79. A second (secondary) winding of transformer 84 may be coupled across the two differential outputs RFOUT, P, and RFOUT, N. Impedance transformation circuit 82 may further include capacitor 86 coupled between differential outputs RFOUT, P, and RFOUT, N and capacitor 88 may couple node 79 to a ground power supply line. In some illustrative configurations of amplifier 52 such as in configurations in which a single-ended output is desired, impedance transformation circuit 82 may be omitted and the output of cascode stage 78 may serve as the output port of amplifier 52.

The single-ended or differential output(s) of amplifier 52 may be coupled to a downstream stage such as a mixer stage in transceiver circuitry 28 for down-converting or demodulating signals. If desired, the output(s) of amplifier 52 may be passed to other stages in front end module 40 and/or transceiver circuity 28 before being received by processor 26.

As described in connection with FIG. 3, amplification transistor 74, during operation, may exhibit non-linear behavior (sometimes referred to herein as non-linearity) that causes the intermodulation distortion of the amplified output signal generated by transistor 74 (e.g., at drain node 77). In other words, the amplified output signal may include undesired components such as intermodulation products or spurious (intermodulated or harmonic) frequency components in addition to the desired components in one or more fundamental frequencies of operation.

In particular, during an amplification operation, bias voltage Vb1 may be supplied to the gate terminal of transistor 74 to operate transistor 74 in a strong inversion mode of operation. An input signal may be received at the gate terminal of transistor 74 through matching network 54 and capacitor 72 while being biased in this strong inversion mode of operation. In this linear regime of transistor operation, the input signal may be amplified to generate an ideally proportional amplified output signal.

However, while being biased in this strong inversion mode, transistor 74 may exhibit one or more non-zero non-linearity coefficients such as a positive second-order non-linearity coefficient gm2, a negative third-order non-linearity coefficient gm3, etc. Accordingly, with the input of radio-frequency signals, transistor 74 may produce signals at spurious frequencies because of the non-zero non-linearity coefficients. These signals at spurious frequencies may be present as spurious frequency components in the amplified output signal.

To suppress (e.g., reduce or remove) these spurious frequency components from the amplified output signal, thereby suppressing non-linearity of transistor 74 due to the negative third-order non-linearity coefficient gm3, amplifier 52 may include an intermodulation distortion suppression circuit such as intermodulation distortion suppression circuit 60 (sometimes referred to as intermodulation distortion rejection circuit 60). Distortion suppression circuit 60 may include an additional auxiliary transistor 90. Transistor 90 may be coupled to node 71 via an input capacitor such as capacitor 92 and may be coupled to amplifier input RFIN via matching network 54 and capacitor 92. In the example of FIG. 4, transistor 90 may be an n-type transistor. N-type transistor 90 may have a drain terminal coupled to drain node 77, a gate terminal coupled to input RFIN via coupling capacitor 72, and a source terminal coupled to source node 81. The gate terminal of transistor 90 may further be coupled to resistor 94, which is configured to receive a bias voltage Vb2 (e.g., through a supply voltage line supplying bias voltage Vb2). Voltage Vb2 may have some intermediate voltage level between the ground voltage level and the positive power supply voltage level Vdd that powers amplifier 52.

In other words, the interconnection between transistor 90, capacitor 92, and resistor 94 within distortion suppression circuit 60 may mirror that of transistor 74, capacitor 72, and resistor 94. Transistors 74 and 90 may be coupled in parallel with each other between nodes 77 and 81. Distortion suppression circuit 60 may be coupled in parallel with the core amplification circuit (e.g., capacitor 72 and transistor 74) between nodes 71 and 77. In such a manner, distortion suppression circuit 60 may form a parallel (auxiliary) amplification path to the core amplification path along which transistor 74 and capacitor 72 are coupled.

Intermodulation distortion suppression circuit 60 may be configured to suppress the non-linearity of transistor 74. In particular, in the example described above, transistor 74 may exhibit a negative (non-zero) third-order non-linearity coefficient gm3 when biased by voltage Vb1 during the amplification operation. Transistor 90 in distortion suppression circuit 60 may be configured and operated to counteract the negative third-order non-linearity coefficient gm3 of transistor 74.

As an example, during the amplification operation performed by transistor 74, bias voltage Vb1 may be supplied to the gate terminal of transistor 74 to operate transistor 74 in a strong inversion state (e.g., a strong inversion mode of transistor operation). An input signal may be received at the gate terminal of transistor 74 (through matching network 54 and capacitor 72) while being biased in this strong inversion mode of operation. In this linear regime of transistor operation, the input signal may be amplified to generate a proportional amplified output signal. However, non-zero higher-order non-linearity coefficients such as third-order non-linearity coefficient gm3 of transistor 74 may cause the input radio-frequency signal to produce spurious output components as spurious frequencies (e.g., intermodulated with the proportional amplified output signal having one or more desired fundamental frequencies).

In this example, transistor 90 may be biased to suppress (e.g., reduce or remove) these spurious output components. In particular, while transistor 74 is configured to be biased by voltage Vb1 in a strong inversion state, transistor 90 may be configured to receive bias voltage Vb2 at its gate terminal through resistor 94 such that transistor 90 is configured in a weak inversion state (e.g., a weak inversion mode of transistor operation). When biased in weak inversion, transistor 90 may exhibit a non-zero higher-order non-linearity coefficient that is opposite (e.g., of opposite sign, an additive inverse) to the corresponding non-zero higher-order non-linearity coefficient exhibited by transistor 74 biased in strong inversion. As an illustrative example, transistor 74 may exhibit a negative third-order non-linearity coefficient gm3, while transistor 90 may exhibit a positive third-order non-linearity coefficient gm3 that is equal in magnitude to the negative third-order non-linearity coefficient gm3 of transistor 74.

Figure 5:
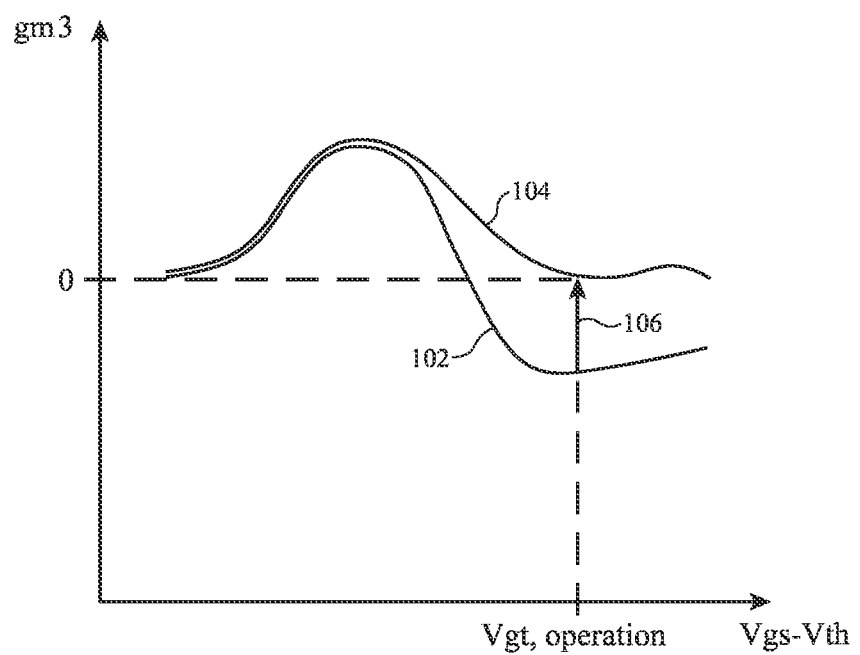
FIG. 5 is a plot showing how an intermodulation distortion suppression circuit of the type shown in FIG. 4 can reduce non-linearity of a signal amplification circuit in accordance with some embodiments.

FIG. 5 is a plot showing how the inclusion of distortion suppression circuit 60 alters the characteristics of the third-order non-linearity coefficient gm3 of transistor 74. As shown in FIG. 5, in the absence of a coupled distortion suppression circuit 60, transistor 74 may exhibit a third-order non-linearity coefficient curve such as curve 102. In particular, curve 102 illustrates a negative third-order non-linearity coefficient gm3 at an illustrative operating voltage $V_{gt,operation}$, $V_{gt}$ being the gate-source voltage $V_{gs}$ applied to transistor 74 subtracted by the threshold voltage $V_{th}$ of transistor 74.

In the presence of a coupled distortion suppression circuit 60 having transistor 90, as shown in FIG. 4, transistors 90 and 74 in combination may exhibit a combined (overall) third-order non-linearity coefficient curve such as curve 104. At the same illustrative operating voltage $V_{gt,operation}$, curve 104 exhibits a combined third-order non-linearity coefficient gm3 that is at or around zero (e.g., third-order non-linearity coefficients gm3 of transistors 90 and 74 may magnitudes within 1% of each other, within 2% of each other, within 5% of each other, within 10% of each other, etc.). In other words, distortion suppression circuit 60 may be configured to shift the third-order non-linearity coefficient gm3 by an amount as indicated by arrow 106.

Because the third-order non-linearity coefficient gm3 of transistor 90 is based on bias voltage Vb2, bias voltage Vb2 may be adjusted to ensure that transistor 90 exhibits a third-order non-linearity coefficient gm3 that is positive and that is equal to or at least approximately equal to the magnitude to the third-order non-linearity coefficient gm3 of transistor 74 (e.g., within 1% of each other, within 2% of each other, within 5% of each other, within 10% of each other, etc.). Configured in this manner, transistor 90 may suppress (e.g., cancel out) spurious signals that would otherwise be generated by transistor 74 based on its negative third-order non-linearity coefficient gm3.

Referring back to FIG. 4, amplifier 52 may further include degeneration inductor circuitry coupled to source node 81 and thereby connected to the source terminal of transistor 74. In the example of FIG. 4, the degeneration inductor circuitry may include inductor 80 coupled to the source terminal of transistor 74. While the degeneration inductor circuitry may help enhance the performance of the core amplification circuit, degeneration inductor circuitry may also cause transistor 74 to exhibit non-linearity.

Accordingly, amplifier 52 may further include harmonic distortion suppression circuit 62 configured to suppress harmonic distortion of transistor 74 that can cause further linearity degradation of amplifier 52 via degeneration inductor feedback. As shown in FIG. 4, distortion suppression circuit 62 may include an LC (inductor-capacitor) circuit such as inductor 96 and (variable) capacitor 98 coupled to in series between source node 81 and a ground power supply line. To implement amplifier 52 in a compact manner, inductor 96 may overlap and couple to inductor 80 via coupling 100 to form a transformer. However, if desired, coupling 100 between inductor 80 and inductor 96 may be omitted.

Figure 6:
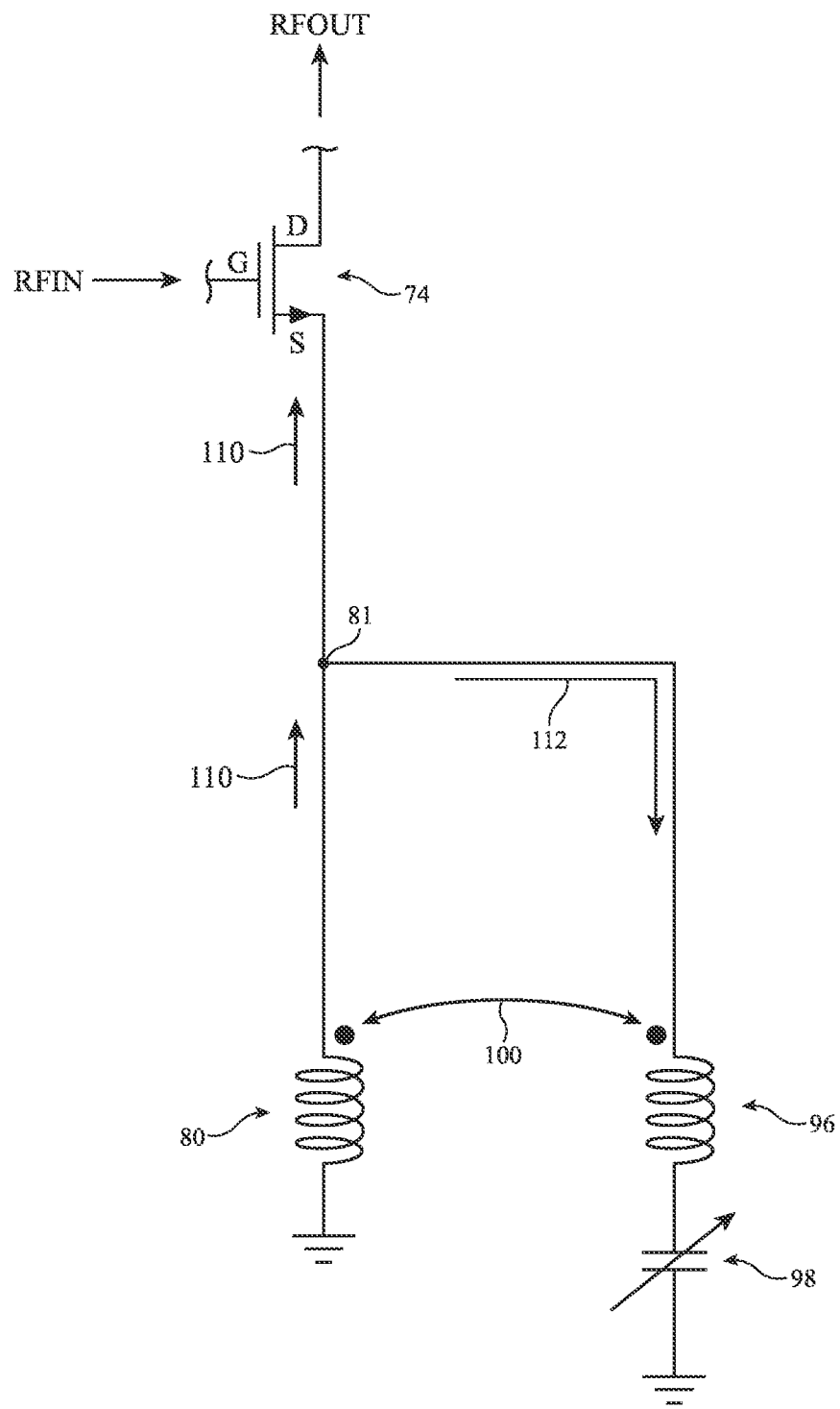
FIG. 6 is a circuit diagram showing how a harmonic distortion suppression circuit of the type shown in FIG. 4 can reduce non-linearity of a signal amplification circuit caused by a degeneration inductor in accordance with some embodiments.

To further illustrate how distortion suppression circuit 62 may help suppress non-linearity of transistor 74, FIG. 6 details the relevant propagation of signals in a portion of amplifier 52. As shown in FIG. 6, the gate terminal (G) of transistor 74 may receive, through some intervening elements, an input radio-frequency signal at input port RFIN of amplifier 52. In response to transistor 74 receiving the radio-frequency signal, degeneration inductor 80 may produce a feedback radio-frequency signal (current) such as signal 110. Signal 110 may propagate to the source terminal (S) of transistor 74 and mix (e.g., intermodulate) with the input signal at the gate terminal through gate-source coupling. The feedback signal from degeneration inductor 80 may cause non-linearity at transistor 74 (e.g., through the non-zero (positive) second-order non-linearity coefficient gm2 of transistor 74), thereby resulting in intermodulation distortion of the amplified output signal supplied at the drain terminal (D) of transistor 74 and ultimately to output port RFOUT of amplifier 52.

In some illustrative configurations described herein as an example, signal 110 may include a spurious frequency component that is a harmonic of the fundamental frequency. In other words, the radio-frequency signal received at the gate terminal of transistor 74 may have a fundamental frequency, and the feedback signal 110 generated at inductor 80 may have a harmonic frequency that is a harmonic of the fundamental frequency. In such a manner, inductor 80 may cause harmonic distortion within amplifier 52. As an example, inductor 80 may generate signal 110 having a second harmonic of the fundamental frequency.

To suppress the generation of the harmonic frequency component of signal 110, and more specifically, the propagation of the harmonic frequency components of signal 110 across the gate and source terminals of transistor 74, an LC circuit forming the harmonic distortion suppression circuit may be coupled to node 81 between inductor 80 and transistor 74. As shown in FIG. 6, inductor 96 and capacitor 98 may be coupled to node 81. Inductor 96 and capacitor 98 may be tuned to the second harmonic of the fundamental frequency. In such a manner, at the second harmonic frequency, inductor 96 and capacitor 98 may form a shorting path 112 between node 81 and the ground power supply line. The second harmonic frequency component in signal 110 may thereby be filtered out using shorting path 112 and be prevented from causing intermodulation distortion at transistor 74. Because inductor 96 and capacitor 98 exhibit filtering functionalities, they may be referred to collective as a filtering circuit, a frequency-selective filter, a filter, or more specifically, a notch filter (e.g., for filtering out the second harmonic frequency component and/or other undesired frequency components of signal 110). Configured in this manner, harmonic distortion suppression circuit 60 may sometimes be referred to as including a filtering circuit.

Inductor 96 and capacitor 98 forming the filtering circuit of harmonic distortion suppression circuit 60 as described in connection with FIGS. 4 and 6 is one illustrative example. If desired, other types notch filters or generally other types of frequency-selective filters may be used to form harmonic distortion suppression circuit 60.

In some illustrative configurations, signal 110 may include a spurious frequency component that is an intermodulation of the fundamental frequency and another frequency (e.g., two in-band tones). If desired, the inductance of inductor 80 may be decreased to a lower inductance and/or transistor 74 may be biased in stronger inversion such that the intermodulation frequency component in signal 110 may be at a suitable level (e.g., below a threshold magnitude level).

At some illustrative frequencies of operation, the effect of the harmonic frequency component of signal 110 may be more detrimental than the effect of the intermodulation product frequency component of signal 110. As such, when operating in at these frequencies the effect of the harmonic frequency component may be suppressed using harmonic distortion suppression circuit 60 (e.g., the LC circuit having inductor 96 and capacitor 98), while dedicated circuitry for suppressing the intermodulation product frequency component of signal 110 may be omitted. If desired, distortion suppression circuit for suppressing the intermodulation product frequency component of signal 110 (e.g., adjustable inductive elements coupled to node 81 for lowering degeneration inductance) may be included in amplifier 52.

Figure 7:
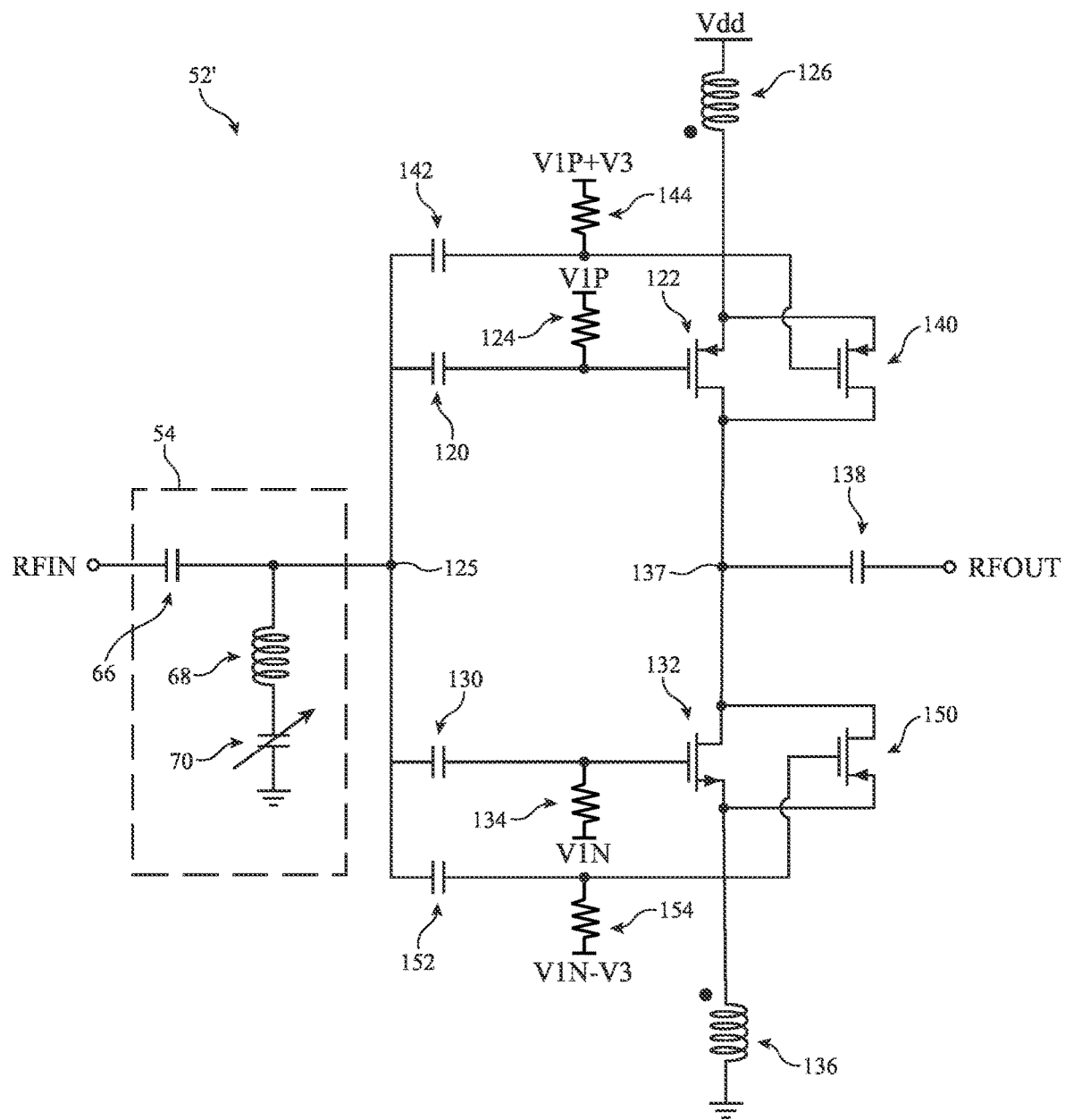
FIG. 7 is a circuit diagram showing an additional illustrative implementation of a low noise amplifier of the type shown in FIG. 3 in accordance with some embodiments.

While FIGS. 4-6 illustrative different types of non-linearity suppression circuitry for one illustrative type of low noise amplifier, other types of low noise amplifiers may also include non-linearity suppression circuitry. FIG. 7 is a circuit diagram of another illustrative low noise amplifier such as low noise amplifier 52' that may include non-linearity suppression circuitry.

In particular, low noise amplifier 52' may be a complementary metal-oxide-semiconductor (CMOS)-based low noise amplifier. As shown in FIG. 7, low noise amplifier 52' may include input matching network 54 (in a similar configuration to that described in connection with FIG. 4) coupling input port RFIN to node 125. The core amplification circuit in CMOS-based low noise amplifier 52' may include two core amplification transistors such as transistor 122 and transistor 132.

Amplification transistor 122 may be coupled to node 125 via an input capacitor such as capacitor 120 and may be coupled to amplifier input RFIN via matching network 54 and capacitor 120. Transistor 122 may be a p-type transistor (e.g., a p-channel transistor such as a p-type metal-oxide-semiconductor or PMOS device). P-type transistor 122 may have a drain terminal coupled to drain node 137, a gate terminal coupled to input RFIN via coupling capacitor 120, and a source terminal coupled to degeneration inductor 126. Inductor 126 may be coupled to a power supply terminal (e.g., a positive power supply voltage line) supplying positive power supply voltage Vdd.

The gate terminal of transistor 122 may further be coupled to resistor 124, which is configured to receive a bias voltage V1P (e.g., through a supply voltage line supplying bias voltage V1P). Voltage V1P may have some intermediate voltage level between the ground voltage level and positive power supply voltage level Vdd that powers amplifier 52'.

Amplification transistor 132 may be coupled to node 125 via an input capacitor such as capacitor 130 and may be coupled to amplifier input RFIN via matching network 54 and capacitor 130. Transistor 132 may be an n-type transistor (e.g., an n-channel transistor such as an n-type metal-oxide-semiconductor or NMOS device). N-type transistor 132 may have a drain terminal coupled to drain node 137, a gate terminal coupled to input RFIN via coupling capacitor 130, and a source terminal coupled to degeneration inductor 136. Inductor 136 may be coupled to a power supply terminal (e.g., a ground power supply voltage line) supplying ground power supply voltage Vss. In the example of FIG. 7, inductor 126 and inductor 136 may overlap and couple to each other to form a transformer.

The gate terminal of transistor 132 may further be coupled to resistor 134, which is configured to receive a bias voltage V1N (e.g., through a supply voltage line supplying bias voltage V1N). Voltage V1N may have some intermediate voltage level between the ground voltage level and positive power supply voltage level Vdd that powers amplifier 52'.

The shared drain node 137 may be coupled to an output port RFOUT of low noise amplifier 52' via an output capacitor 138. Low noise amplifier 52' may receive an input radio-frequency signal having one or more fundamental frequencies (e.g., from an antenna) and may generate an amplified version of the input radio-frequency signal as the output radio-frequency signal. The output radio-frequency signal may be provided to downstream processing circuitry such as a mixer stage.

Transistor 122 and transistor 132 may exhibit non-linearities. To suppress these non-linearities, amplifier 52' may include non-linearity suppression circuitry 58 (FIG. 3). In the example of FIG. 7, non-linearity suppression circuitry 58 may include (auxiliary) transistor 140 and auxiliary transistor 150.

For the PMOS portion of non-linearity suppression circuitry 58, transistor 140 may be coupled to node 125 via an input capacitor such as capacitor 142 and may be coupled to amplifier input RFIN via matching network 54 and capacitor 142. In the example of FIG. 7, transistor 140 may be a p-type transistor. P-type transistor 140 may have a drain terminal coupled to drain node 137, a gate terminal coupled to input RFIN via coupling capacitor 142, and a source terminal coupled between the source terminal of transistor 122 and degeneration inductor 126. The gate terminal of transistor 140 may further be coupled to resistor 144, which is configured to receive a bias voltage V1P+V3, which is at a voltage level that is the sum of bias voltage V1P and additional offset voltage V3, (e.g., through a supply voltage line supplying bias voltage V1P+V3). Voltage bias voltage V1P+V3 may have some intermediate voltage level between the ground voltage level and the positive power supply voltage level Vdd that powers amplifier 52'.

In other words, the interconnection between transistor 140, capacitor 142, and resistor 144 within non-linearity suppression circuitry 58 may mirror that of transistor 122, capacitor 120, and resistor 124. In particular, transistors 122 and 140 may be coupled in parallel with each other between drain node 137 and inductor 126. This PMOS portion of non-linearity suppression circuitry 58 (e.g., capacitor 142 and transistor 140) may serve as a parallel amplifying path to the PMOS portion of the core amplification circuit (e.g., capacitor 120 and transistor 122) between nodes 125 and 137.

In a similar manner as described above in connection with auxiliary transistor 90 with respect to main transistor 74 in FIG. 4, transistor 140 may be configured to suppress the non-linearity of transistor 122. As an example, transistor 122 may exhibit a negative (non-zero) third-order non-linearity coefficient gm3 when biased by voltage V1P during amplification operation. Transistor 140 in non-linearity suppression circuitry 58 may be configured and operated to counteract the negative third-order non-linearity coefficient gm3 of transistor 74.

In an illustrative configuration described herein, transistor 122 may be biased by voltage V1P to operate in a strong inversion transistor state, while transistor 140 may be configured to biased by voltage V1P+V3 at its gate terminal (through resistor 144) such that transistor 140 is configured in a weak inversion mode of transistor operation. When biased in this weak inversion mode, transistor 140 may exhibit a non-zero higher-order non-linearity coefficient that is opposite (e.g., of opposite sign) to the corresponding non-zero higher-order non-linearity coefficient exhibited by transistor 122 biased in strong inversion. As an example in these biased states, transistor 122 may exhibit a negative third-order non-linearity coefficient gm3, while transistor 140 may exhibit a positive third-order non-linearity coefficient gm3 that is equal in magnitude to the negative third-order non-linearity coefficient gm3 of transistor 122. In this manner, spurious signals generated by transistor 132 based on its negative third-order non-linearity coefficient gm3 may be suppressed.

For the NMOS portion of non-linearity suppression circuitry 58, transistor 150 may be coupled to node 125 via an input capacitor such as capacitor 152 and may be coupled to amplifier input RFIN via matching network 54 and capacitor 152. In the example of FIG. 7, transistor 150 may be an n-type transistor. N-type transistor 150 may have a drain terminal coupled to drain node 137, a gate terminal coupled to input RFIN via coupling capacitor 152, and a source terminal coupled between the source terminal of transistor 132 and degeneration inductor 136. The gate terminal of transistor 150 may further be coupled to resistor 154, which is configured to receive a bias voltage V1N−V3, which is at a voltage level that is the difference of bias voltage V1N and the additional offset voltage V3, (e.g., through a supply voltage line supplying bias voltage V1N−V3). Voltage bias voltage V1N−V3 may have some intermediate voltage level between the ground voltage level and the positive power supply voltage level Vdd that powers amplifier 52'. The offset voltage V3 used for the bias voltage received by transistors 150 and 140 may be the same (or may be different if desired).

In other words, the interconnection between transistor 150, capacitor 152, and resistor 154 within non-linearity suppression circuitry 58 may mirror that of transistor 132, capacitor 130, and resistor 134. In particular, transistors 132 and 150 may be coupled in parallel with each other between drain node 137 and inductor 136. This NMOS portion of non-linearity suppression circuitry 58 (e.g., capacitor 142 and transistor 140) may serve as a parallel amplifying path to the NMOS portion of the core amplification circuit (e.g., capacitor 130 and transistor 132) between nodes 125 and 137.

In a similar manner as described above in connection with auxiliary transistor 90 with respect to main transistor 74 in FIG. 4, transistor 150 may be configured to suppress the non-linearity of transistor 132. As an example, transistor 132 may exhibit a negative (non-zero) third-order non-linearity coefficient gm3 when biased by voltage V1N during amplification operation. Transistor 150 in non-linearity suppression circuitry 58 may be configured and operated to counteract the negative third-order non-linearity coefficient gm3 of transistor 132.

In an illustrative configuration described herein, transistor 132 may be biased by voltage V1N to operate in a strong inversion transistor state, while transistor 150 may be configured to biased by voltage V1N−V3 at its gate terminal (through resistor 154) such that transistor 150 is configured in a weak inversion mode of transistor operation. When biased in this weak inversion mode, transistor 150 may exhibit a non-zero higher-order non-linearity coefficient that is opposite (e.g., of opposite sign) to the corresponding non-zero higher-order non-linearity coefficient exhibited by transistor 132 biased in strong inversion. As an example in these biased states, transistor 132 may exhibit a negative third-order non-linearity coefficient gm3, while transistor 150 may exhibit a positive third-order non-linearity coefficient gm3 that is equal in magnitude to the negative third-order non-linearity coefficient gm3 of transistor 132. In this manner, spurious signals generated by transistor 132 based on its negative third-order non-linearity coefficient gm3 may be suppressed.

Degeneration inductor 126 may contribute the non-linearity of the PMOS portion of amplifier 52' (e.g., PMOS transistors 122 and 140). In a similar manner as described in connection with FIG. 6, degeneration inductor 126 may produce a harmonic frequency signal that intermodulate with the input radio-frequency signal having the fundamental frequency at transistors 122 and 140, thereby causing intermodulation distortion through the combined non-zero (negative) second-order non-linearity coefficient gm2 of transistors 122 and 140 (e.g., the second-order non-linearity coefficient gm2 of transistor 122 summed with the second-order non-linearity coefficient gm2 of transistor 140).

By an analogous process, degeneration inductor 136 may also contribute the non-linearity of the NMOS portion of amplifier 52' (e.g., NMOS transistors 132 and 150). In a similar manner as described in connection with FIG. 6, degeneration inductor 136 may produce a harmonic frequency signal that intermodulate with the input radio-frequency signal having the fundamental frequency at transistors 132 and 150, thereby causing intermodulation distortion through the combined non-zero (positive) second-order non-linearity coefficient gm2 of transistors 132 and 150 (e.g., the second-order non-linearity coefficient gm2 of transistor 132 summed with the second-order non-linearity coefficient gm2 of transistor 150).

This type of intermodulation distortion through the second-order non-linearity coefficient gm2 of the amplification transistors 122, 140, 132, and 150 may be suppressed by biasing the PMOS transistors 122 and 140 to exhibit an overall negative second-order non-linearity coefficient gm2 and by biasing the NMOS transistors 132 and 150 to exhibit an overall positive second-order non-linearity coefficient gm2 that is equal in magnitude to the overall negative second-order non-linearity coefficient gm2 of PMOS transistors 122 and 140.

In particular, voltages V1N, VIP, VIP+V3, and V1P−V3 may be supplied at appropriate voltage levels (e.g., by one or more power supplies, one or more level shifters, etc.) to bias transistors 122, 140, 132, and 150 in a mode of operation in which the overall (summed) second-order non-linearity coefficient gm2 across all four transistors is zero. In such a manner, The power supply terminals (e.g., rails) may be described herein as a portion of the non-linearity suppression circuitry.

The methods and operations described above in connection with FIGS. 1-7 may be performed by the components of device 10 using software, firmware, and/or hardware (e.g., dedicated circuitry or hardware). Software code for performing these operations may be stored on non-transitory computer readable storage media (e.g., tangible computer readable storage media) stored on one or more of the components of device 10 (e.g., storage circuitry 16 and/or wireless communications circuitry 24 of FIG. 1). The software code may sometimes be referred to as software, data, instructions, program instructions, or code. The non-transitory computer readable storage media may include drives, non-volatile memory such as non-volatile random-access memory (NVRAM), removable flash drives or other removable media, other types of random-access memory, etc. Software stored on the non-transitory computer readable storage media may be executed by processing circuitry on one or more of the components of device 10 (e.g., processing circuitry in wireless circuitry 24, processing circuitry 18 of FIG. 1, etc.). The processing circuitry may include microprocessors, application processors, digital signal processors, central processing units (CPUs), application-specific integrated circuits with processing circuitry, or other processing circuitry.

The foregoing is merely illustrative and various modifications can be made to the described embodiments. The foregoing embodiments may be implemented individually or in any combination.

What is claimed is:

1. Amplifier circuitry comprising:
an amplification transistor having a gate terminal configured to receive a radio-frequency signal, a drain terminal coupled to an output port of the amplifier circuitry, and a source terminal;
a degeneration inductor coupled to the source terminal of the amplification transistor and coupled to a supply voltage terminal; and
a filter coupled in parallel with the degeneration inductor between the source terminal of the amplification transistor and the supply voltage terminal.

2. The amplifier circuitry of claim 1, wherein the filter comprises an additional inductor that is coupled in parallel with the degeneration inductor between the source terminal of the amplification transistor and the supply voltage terminal.

3. The amplifier circuitry of claim 1, wherein the radio-frequency signal has a fundamental frequency and the filter comprises a notch filter configured to filter out a harmonic frequency of the fundamental frequency.

4. The amplifier circuitry of claim 1, wherein the filter comprises:
an additional inductor having a first terminal coupled to the source terminal of the amplification transistor and having a second terminal; and
a capacitor having a first terminal coupled to the second terminal of the inductor and having a second terminal coupled to the supply voltage terminal.

5. The amplifier circuitry of claim 4, wherein the capacitor comprises an adjustable capacitance.

6. The amplifier circuitry of claim 4, wherein the additional inductor of the filter is coupled to the degeneration inductor to form a transformer.

7. The amplifier circuitry of claim 1 further comprising:
an auxiliary transistor having a gate terminal configured to receive the radio-frequency signal, a drain terminal coupled to the output port of the amplifier circuitry, and a source terminal coupled to the source terminal of the amplification transistor.

8. The amplifier circuitry of claim 7, wherein the filter is coupled to the source terminal of the amplification transistor and the source terminal of the auxiliary transistor.

9. The amplifier circuitry of claim 1 further comprising:
an input matching network coupled between an input port of the amplifier circuitry and the gate terminal of the amplification transistor; and
an input capacitor having a first terminal coupled to the input matching network and a second terminal coupled to the gate terminal of the amplification transistor.

10. The amplifier circuitry of claim 9 further comprising:
a cascode stage coupled between the drain terminal of the amplification transistor and the output port of the amplifier circuitry.

11. The amplifier circuitry of claim 10, wherein the output port of the amplifier circuitry forms a differential output, the amplifier circuitry further comprising:
a transformer coupled between the cascode stage and the differential output.

12. An amplifier comprising:
a first transistor having a gate terminal configured to receive a radio-frequency signal, a source terminal, and a drain terminal, the gate terminal of the first transistor being configured to receive a first bias voltage that biases the first transistor in strong inversion;
a second transistor having a gate terminal configured to receive the radio-frequency signal, a source terminal coupled to the source terminal of the first transistor, and a drain terminal coupled to the drain terminal of the first transistor, the gate terminal of the second transistor being configured to receive a second bias voltage that biases the second transistor in weak inversion;
a degeneration inductor coupled to the source terminal of the first transistor; and
a filter coupled to the source terminal of the first transistor and coupled to the source terminal of the second transistor.

13. The amplifier of claim 12, wherein the drain terminal of the first transistor is coupled to an output port of the amplifier and the drain terminal of the second transistor is coupled to the output port of the amplifier.

14. The amplifier of claim 13, wherein the degeneration inductor is coupled to the source terminal of the second transistor.

15. The amplifier of claim 12 further comprising:
a first resistor having a first terminal coupled to a first voltage supply terminal and having a second terminal coupled to the gate terminal of the first transistor; and
a second resistor having a first terminal coupled to a second voltage supply terminal and having a second terminal coupled to the gate terminal of the second transistor.

16. The amplifier of claim 15, wherein the first voltage supply terminal is configured to supply the first bias voltage through the first resistor to the gate terminal of the first transistor and the second voltage supply terminal is configured to supply the second bias voltage through the second resistor to the gate terminal of the second transistor.

17. The amplifier of claim 12, wherein the first transistor biased in strong inversion has a first non-linearity coefficient and the second transistor biased in weak inversion has a second non-linearity coefficient that has an opposite sign compared to the first non-linearity coefficient.

18. Amplifier circuitry comprising:
an amplification transistor configured to receive radio-frequency signals and to output corresponding amplified radio-frequency signals;
an inductor having a terminal coupled to the source terminal of the amplification transistor; and
a distortion suppression circuit that is configured to suppress non-linearity distortion of the amplified radio-frequency signals and that includes a filter coupled to the source terminal of the amplification transistor, coupled to the inductor, and configured to provide a shorting path between the source terminal of the amplifier transistor and a supply voltage terminal to filter out a portion of a signal generated by the inductor.

19. The amplifier circuitry of claim 18, wherein the radio-frequency signals have a fundamental frequency, and the filter at least partly forms a harmonic distortion suppression circuit configured to filter out the portion of the signal that is generated by the inductor, the portion being associated with a harmonic of the fundamental frequency.

20. The amplifier circuitry of claim 18, wherein the amplification transistor has a first non-linearity coefficient, the distortion suppression circuit includes an intermodulation distortion suppression circuit, and the intermodulation distortion suppression circuit includes an auxiliary transistor having a second corresponding non-linearity coefficient opposite the first non-linearity coefficient of the amplification transistor.

* * * * *